(12) United States Patent
Enge

(10) Patent No.: US 9,678,133 B2
(45) Date of Patent: Jun. 13, 2017

(54) INTELLIGENT PATCHING SYSTEMS AND METHODS USING ELECTRICAL CABLE DIAGNOSTIC TESTS AND INFERENCE-BASED MAPPING TECHNIQUES

(71) Applicant: CommScope, Inc. of North Carolina, Hickory, NC (US)

(72) Inventor: Ryan E. Enge, Carrollton, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 625 days.

(21) Appl. No.: 13/768,225

(22) Filed: Feb. 15, 2013

(65) Prior Publication Data

US 2013/0234725 A1 Sep. 12, 2013

Related U.S. Application Data

(60) Provisional application No. 61/609,471, filed on Mar. 12, 2012.

(51) Int. Cl.
*H04Q 5/22* (2006.01)
*H01R 13/66* (2006.01)
*H04M 1/24* (2006.01)
*G01R 31/04* (2006.01)
*H04Q 1/02* (2006.01)

(52) U.S. Cl.
CPC .............. *G01R 31/04* (2013.01); *H04Q 1/136* (2013.01)

(58) Field of Classification Search
CPC .............................. H04Q 1/136; G01R 31/023

USPC .................. 324/66, 538, 539, 628; 370/200; 340/653, 10

See application file for complete search history.

(56) References Cited

U.S. PATENT DOCUMENTS

| | | | |
|---|---|---|---|
| 5,394,503 | A | 2/1995 | Dietz, Jr. et al. |
| 5,406,260 | A | 4/1995 | Cummings et al. |
| 5,483,467 | A | 1/1996 | Krupka et al. |
| 5,550,755 | A | 8/1996 | Martin et al. |
| 5,764,043 | A | 6/1998 | Czosnowski et al. |
| 5,854,824 | A | 12/1998 | Bengal et al. |
| 6,002,331 | A | 12/1999 | Laor |
| 6,222,908 | B1 | 4/2001 | Bartolutti et al. |
| 6,285,293 | B1 | 9/2001 | German et al. |
| 6,330,307 | B1 | 12/2001 | Bloch et al. |
| 6,350,148 | B1 | 2/2002 | Bartolutti et al. |
| 6,424,710 | B1 | 7/2002 | Bartolutti et al. |

(Continued)

OTHER PUBLICATIONS

Gabara T., "Phantom Mode Signaling in VLSI Systems," *Proceedings Advanced Research in VLSI*, Mar. 14, 2001, pp. 88-100.

*Primary Examiner* — Son Le
*Assistant Examiner* — Alesa Allgood
(74) *Attorney, Agent, or Firm* — Fogg & Powers LLC

(57) ABSTRACT

A new patch cord connection in a communications network may be automatically identified by using a plug insertion/removal sensor to detect the insertion of a first plug into a first connector port of a patch panel. An electrical cable diagnostic test is used to detect an insertion of a second plug into a first connector port on a network device. It may be inferred that a new patch cord connection has been established between the first connector port of the patch panel and the first connector port of the network device based on the consecutive detections of the insertions of the first and second plugs.

14 Claims, 8 Drawing Sheets

(56) References Cited

U.S. PATENT DOCUMENTS

| | | |
|---|---|---|
| 6,522,737 B1 | 2/2003 | Bartolutti et al. |
| 6,532,215 B1 | 3/2003 | Muntz |
| 6,705,707 B2 | 3/2004 | Furukawa |
| 6,725,177 B2 | 4/2004 | David et al. |
| 6,784,802 B1 | 8/2004 | Stanescu |
| 6,961,675 B2 | 11/2005 | David |
| 6,968,994 B1 | 11/2005 | Ashwood Smith |
| 6,985,713 B2 | 1/2006 | Lehr et al. |
| 7,106,071 B2 | 9/2006 | Pharn et al. |
| 7,139,668 B2 | 11/2006 | Bechhoefer |
| 7,153,142 B2 | 12/2006 | Shifris et al. |
| 7,160,143 B2 | 1/2007 | David et al. |
| 7,164,274 B2 | 1/2007 | Pharn et al. |
| 7,170,393 B2 | 1/2007 | Martin |
| 7,193,422 B2 | 3/2007 | Velleca et al. |
| 7,217,152 B1 | 5/2007 | Xin et al. |
| 7,289,449 B1 | 10/2007 | Rubinstein et al. |
| 7,297,018 B2 | 11/2007 | Caveney et al. |
| 7,370,106 B2 | 5/2008 | Caveney et al. |
| 7,414,410 B2 | 8/2008 | Pharn et al. |
| 7,517,243 B2 | 4/2009 | Caveney et al. |
| 7,573,254 B2 | 8/2009 | Cobb et al. |
| 7,664,232 B2 | 2/2010 | Sherman |
| 7,705,606 B2 | 4/2010 | Peyton et al. |
| 7,719,992 B1 | 5/2010 | Gourlay et al. |
| 7,737,704 B2 | 6/2010 | Diab et al. |
| 7,738,387 B2 | 6/2010 | Diab et al. |
| 7,769,090 B2 * | 8/2010 | Peleg et al. .................. 375/257 |
| 8,638,651 B2 * | 1/2014 | Michaelis et al. ............ 370/200 |
| 8,643,476 B2 * | 2/2014 | Pinn ........................ H04Q 1/136 340/10.1 |
| 8,670,335 B2 * | 3/2014 | Barkan et al. ................ 370/252 |
| 2002/0090858 A1 * | 7/2002 | Caveney ....................... 439/490 |
| 2004/0021452 A1 | 2/2004 | Hwang et al. |
| 2005/0245127 A1 | 11/2005 | Nordin et al. |
| 2006/0160396 A1 | 7/2006 | Macauley et al. |
| 2006/0164998 A1 | 7/2006 | Pharn |
| 2007/0117444 A1 | 5/2007 | Caveney et al. |
| 2007/0243725 A1 | 10/2007 | Nordin et al. |
| 2008/0122579 A1 * | 5/2008 | German ............ H01R 13/6683 340/10.1 |
| 2008/0265915 A1 | 10/2008 | Clark et al. |
| 2009/0096581 A1 | 4/2009 | Macauley et al. |
| 2009/0175195 A1 * | 7/2009 | Macauley ..................... 370/254 |
| 2009/0178119 A1 | 7/2009 | Macauley |
| 2010/0008482 A1 | 1/2010 | Tucker |
| 2010/0011097 A1 | 1/2010 | Cobb |
| 2010/0085156 A1 | 4/2010 | Tucker |
| 2010/0244998 A1 | 9/2010 | Peyton et al. |
| 2011/0043371 A1 | 2/2011 | German et al. |
| 2011/0097925 A1 | 4/2011 | Caveney et al. |
| 2012/0128136 A1 * | 5/2012 | German ............ H01R 13/6683 379/32.01 |

\* cited by examiner

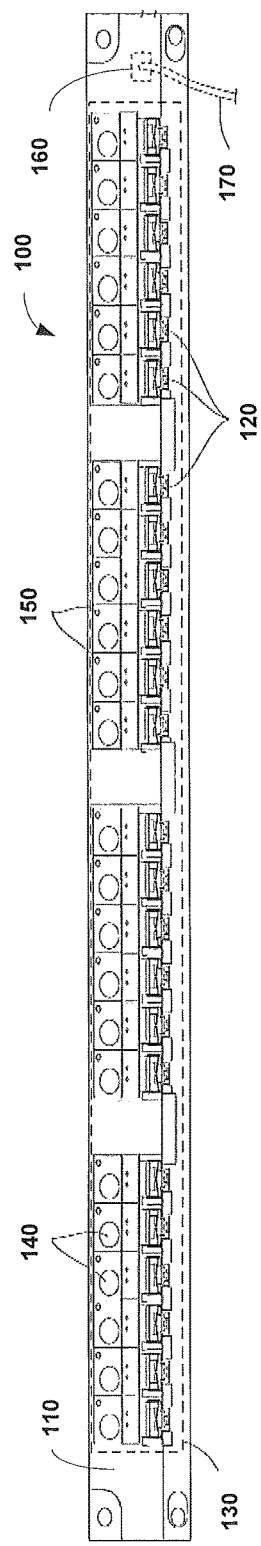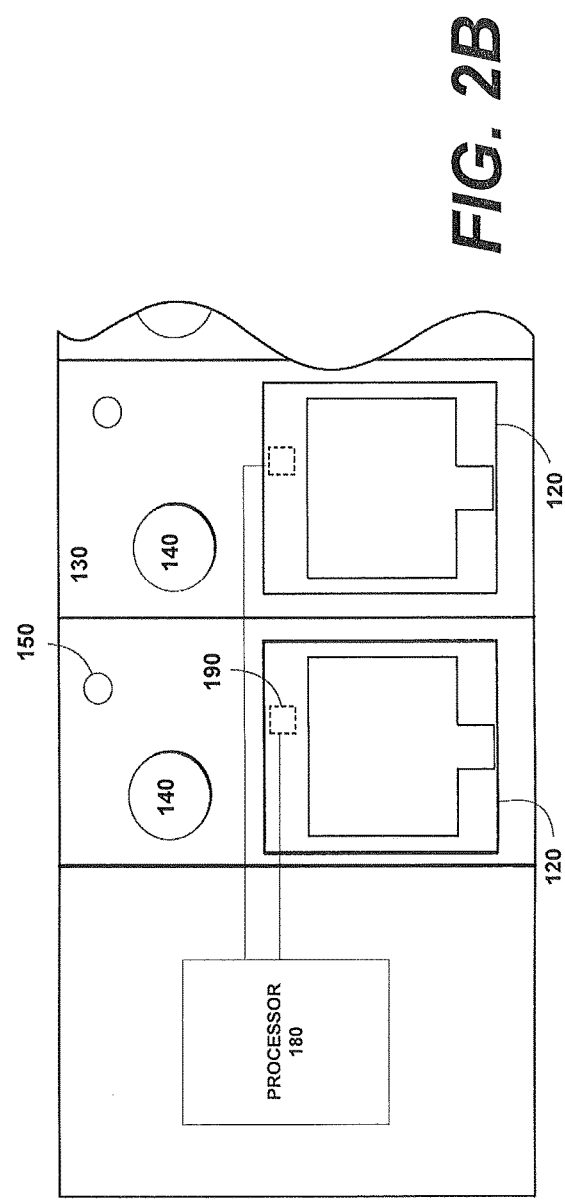

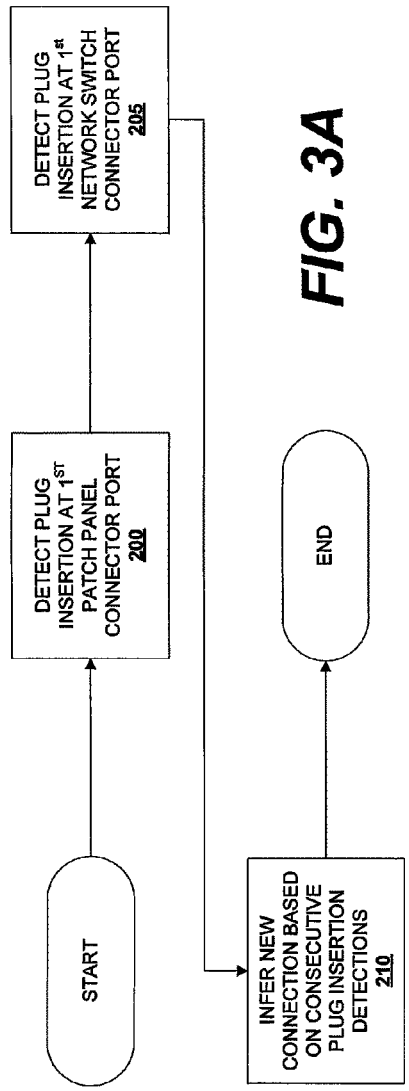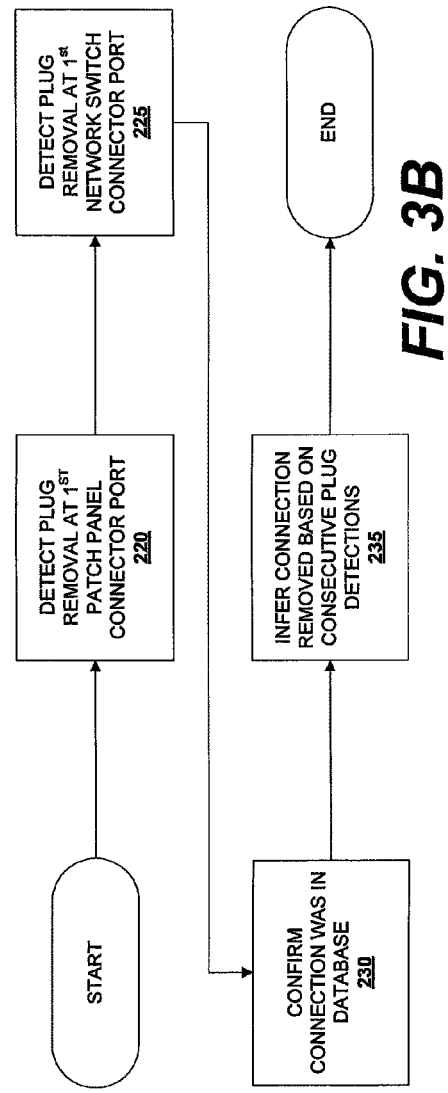

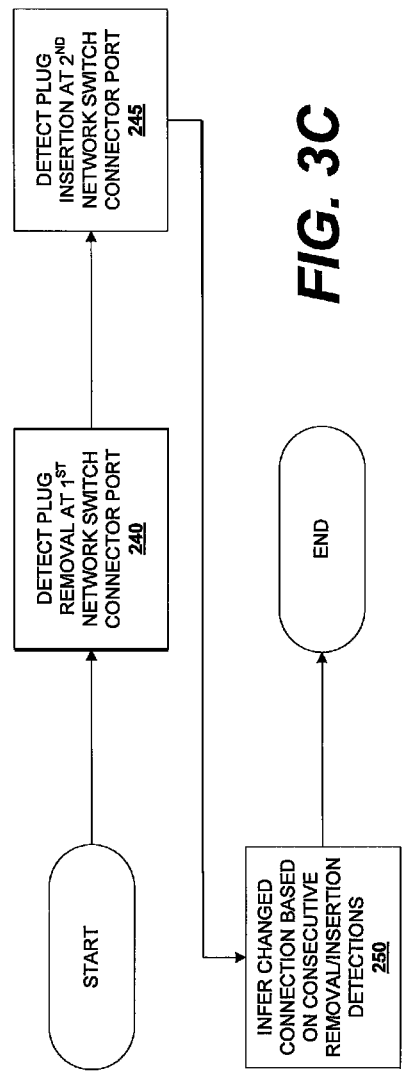

INTELLIGENT PATCHING SYSTEMS AND METHODS USING ELECTRICAL CABLE DIAGNOSTIC TESTS AND INFERENCE-BASED MAPPING TECHNIQUES

CROSS-REFERENCE TO RELATED APPLICATION

The present application claims priority under 35 U.S.C. §119 to U.S. Provisional Patent Application Ser. No. 61/609,471, filed Mar. 12, 2012, the entire contents of which is incorporated herein by reference as if set forth in its entirety.

FIELD OF THE INVENTION

The present invention relates generally to communications systems and, more particularly, to automatically tracking cabling connections in communications systems.

BACKGROUND

Most businesses, government agencies, schools and other organizations employ dedicated communications systems (also referred to as "networks") that enable computers, servers, printers, facsimile machines, telephones, security cameras and the like to communicate with each other, through a private network, and with remote locations via a telecommunications service provider. Such communications system may be hard-wired through, for example, the walls and/or ceilings of a building using communications cables and connectors. Typically, the communications cables contain eight insulated conductors such as copper wires that are arranged as four differential twisted pairs of conductors. Each twisted pair may be used to transmit a separate differential communications signal. Individual communications connectors (which are also referred to herein as "connector ports") such as RJ-45 style modular wall jacks are mounted in offices, conference rooms and other work areas throughout the building. The communications cables and any intervening connectors provide communications paths from the connector ports (e.g., modular wall jacks) in offices and other rooms, hallways and common areas of the building (referred to herein as "work area outlets") to network devices (e.g., network switches, servers, memory storage devices, etc.) that may be located in a computer room, telecommunications closet or the like. Communications cables from external telecommunication service providers may also terminate within the computer room or telecommunications closet.

A commercial data center is a facility that may be used to run the computer-based applications that handle the core electronic business and operational data of one or more organizations. The expansion of the Internet has also led to a growing need for a so-called "Internet data centers," which are data centers that are used by online retailers, Internet portals, search engine companies and the like to provide large numbers of users simultaneously, secure, high-speed, fail-safe access to their web sites. Both types of data centers may host hundreds, thousands or even tens of thousands of servers, routers, memory storage systems and other associated equipment. In these data centers, fiber optic communications cables and/or communications cables that include four differential pairs of insulated conductive (e.g., copper) wires are typically used to provide a hard-wired communications system that interconnects the data center equipment.

In both office network and data center communications systems, the communications cables that are connected to end devices (e.g., servers, memory storage devices, network switches, work area computers, printers, facsimile machines, etc.) may terminate into one or more communications patching systems that may simplify later connectivity changes. Typically, a communications patching system includes one or more "patch panels" that are mounted on equipment rack(s) or in cabinet(s), and a plurality of "patch cords" that are used to make interconnections between patch panels, network switches and other network devices. As is known to those of skill in the art, a "patch cord" refers to a communications cable that has a connector such as, for example, an RJ-45 plug, on at least one end thereof. A "patch panel" refers to an interconnection device that includes a plurality (e.g., 24 or 48) of connector ports. Each connector port (e.g., an RJ-45 jack) on a patch panel may have a plug aperture on a front side thereof that is configured to receive the connector of a patch cord (e.g., an RJ-45 plug), and the back end of each connector port may be configured to receive a communications cable. Each connector port on a patch panel acts to connect the conductors of the patch cord that is plugged into the front side of the connector port with the corresponding conductors of the communications cable that is terminated into the back end of the connector port.

In a typical office network, "horizontal" cables are used to connect each work area outlet (which typically are RJ-45 jacks) to the back end of a respective connector port (which also typically are RJ-45 jacks) on a set of patch panels. The first end of each of these horizontal cables is terminated into the back end of one of the work area outlets, and the second end of each of these horizontal cables is terminated into the back end of a respective one of the connector ports on the patch panel. In an "interconnect" patching system, a single set of patch cords is used to directly connect the connector ports on the set of patch panels to respective connector ports on network switches. In a "cross-connect" patching system, two sets of patch panels are provided, where the first set of patch cords is used to connect the connector ports on the set of patch panels to respective connector ports on a second set of patch panels, and the second set of (typically single-ended) patch cords is used to connect the connector ports on the second set of patch panels to respective connector ports on the network switches. In both interconnect and cross-connect patching systems the cascaded set of plugs, jacks and cable segments that connect a connector port on a network switch to a work area end device is typically referred to as a channel.

The connections between the work area end devices and the network switches may need to be changed for a variety of reasons, including equipment changes, adding or deleting users, office moves, etc. In an interconnect patching system, these connections are typically changed by rearranging the patch cords that run between the set of patch panels and the network switches. In a cross-connect patching system, the connections between the work area end devices and the network switches are typically changed by rearranging the patch cords in the set of patch cords that run between these two sets of patch panels.

The patch cord connections are typically recorded in a computer-based connectivity database. Each time patching changes are made, this connectivity database is updated to reflect the new patching connections. Unfortunately, in practice technicians may neglect to update the connectivity database each and every time a change is made, and/or may make errors in logging changes. As such, the connectivity database may not be complete and/or accurate.

In order to reduce or eliminate such errors, a variety of systems have been proposed that automatically log the patch cord connections in a communications patching system. These automated or "intelligent" patching systems typically use special patch panels that employ sensors, radio frequency identification tags, serial ID chips, common mode signalling and the like and/or special patch cords that include an additional conductor to detect patch cord insertions and removals and/or to automatically track patching connections.

SUMMARY

Pursuant to embodiments of the present invention, methods of automatically identifying a new patch cord connection in a communications network are provided. Pursuant to these methods, a plug insertion/removal sensor is used to detect the insertion of a first plug into a first connector port of a patch panel. An electrical cable diagnostic test is used to detect an insertion of a second plug into a first connector port on a network device. It may be inferred that a new patch cord connection has been established between the first connector port of the patch panel and the first connector port of the network device based on the consecutive detections of the insertions of the first and second plugs.

In some embodiments, the network device may be a network switch, and the electrical cable diagnostic test may be a time domain reflectometry test. The electrical cable diagnostic test may be performed in response to detecting that a plug has been inserted into a plug aperture of the first connector port on the patch panel. A channel length may be stored for at least some of a plurality of connector ports that are provided on the network switch. The electrical cable diagnostic test may be performed on each connector port on the network switch that has a stored channel length of approximately zero. The electrical cable diagnostic test may be used to detect an insertion of the second plug into the first connector port on the network device by conducting the electrical cable diagnostic test and then determining based on the electrical cable diagnostic test that a length of the channel connected to the connector port on the network device is greater than approximately zero. The inferred patch cord connection between the connector port on the network device and the connector port on the patch panel may be logged in a connectivity database.

Pursuant to embodiments of the present invention, methods of automatically identifying a removal of a patch cord connection are provided in which a plug insertion/removal sensor is used to detect the removal of a first plug from a first connector port of a patch panel. An electrical cable diagnostic test is used to detect a removal of a second plug from a first connector port on a network device. It may then be inferred that a patch cord that connected the first connector port of the patch panel to the first connector port of the network device has been removed based on the consecutive detections of the removals of the first and second plugs. The electrical cable diagnostic test may be a time domain reflectometry test.

Pursuant to embodiments of the present invention, methods of automatically identifying a change to a patch cord connection in a communications network are provided in which a first electrical cable diagnostic test is used to detect the removal of a first plug from a first connector port of a network device. A second electrical cable diagnostic test is used to detect an insertion of a second plug into a second connector port of the network device. It may then be inferred that the first and second plugs are the same plug based on the consecutive detections of the removal of the first plug and the insertion of the second plug. The first and second electrical cable diagnostic tests may be time domain reflectometry tests that are used to determine a channel length.

BRIEF DESCRIPTION OF THE DRAWINGS

FIG. 2A is a schematic front view of a patch panel according to embodiments of the present invention that may be used as one of the patch panels in FIG. 1.

FIG. 2B is an enlarged front view of a portion of a printed circuit board of the patch panel of FIG. 2A.

FIG. 3A is a flow chart diagram illustrating a method of automatically identifying a new patching connection according to certain embodiments of the present invention.

FIG. 3B is a flow chart diagram illustrating a method of automatically identifying the removal of a patch cord connection according to certain embodiments of the present invention.

FIG. 3C is a flow chart diagram illustrating a method of automatically identifying a change to a patching connection according to certain embodiments of the present invention.

DETAILED DESCRIPTION

Figure 1:
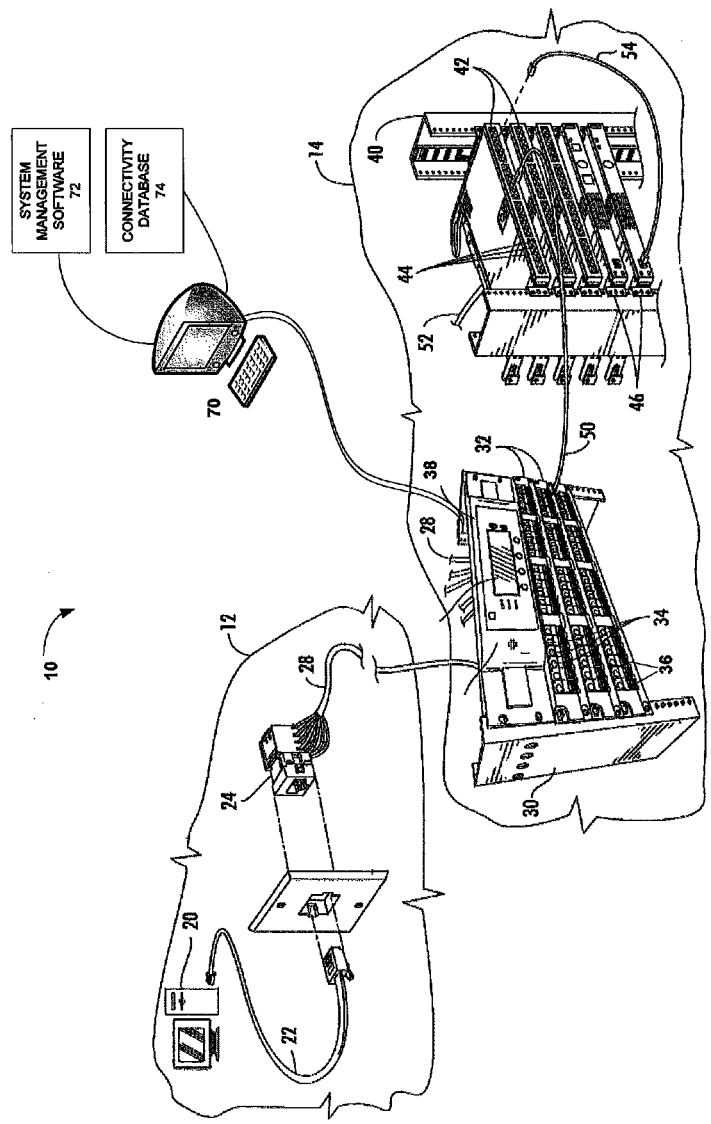
FIG. 1 is a simplified, schematic view of an intelligent patching system according to certain embodiments of the present invention that is suitable for use in an interconnect communications patching system.

Pursuant to embodiments of the present invention, methods and systems of automatically tracking patch cord connections in a communications patching system are provided which use time domain reflectometry and inference based mapping techniques.

By way of background, one known technique for automatically logging or "mapping" the patch cord connections in a cross-connect communications patching system is referred to as the "logical inference" technique. With this technique, each patch panel in the communications patching system includes a plug insertion/removal sensor at each of its connector ports. A "plug insertion/removal sensor" refers to any type of sensor that detects an insertion of a plug into a connector port and/or the removal of a plug from a connector port. Exemplary plug insertion/removal sensors include mechanical switches that detect the presence and/or absence of a plug (or of an associated patch cord cable), infrared sensors, and sensors that detect the presence of a plug electrically, magnetically and/or wirelessly such as sensors that use serial ID chips, RFID chips and the like. Each plug insertion/removal sensor is in communications with a common controller such as a system administration software package. The logical inference technique works by detecting plug insertions and/or removals that are adjacent to each other in time and then making logical inferences regarding the patching connections based on the consecutive nature of these plug insertions/removals.

The above-described logical inference technique may be used to automatically map a new patching connection as follows. When a technician inserts the plug on the first end of the new patch cord into, for example, a first patch panel connector port, the plug insertion/removal sensor associated with that connector port senses the plug insertion and notifies the system administration software that a plug has been inserted into the first patch panel connector port. The technicians that operate and maintain the communications patching system are taught that they must fully complete each new patch cord connection before moving to another task. Accordingly, when the system administration software receives notice from another plug insertion/removal sensor that a plug has been plugged into a second patch panel connector port, the system administration software assumes that the technician has properly followed the procedures, and hence makes a "logical inference" that a patch cord has been added between the first and second patch panel connector ports (which may be on the same patch panel or on a different patch panel). Thus, so long as the technicians properly follow the conventions for adding new patch cord connections, the communications patching system may use the plug insertion/removal sensors provided on the patch panels and the "logical inference" technique to automatically identify (and store in a connectivity database) the two patch panel connector ports that each newly-added patch cord extends between.

The logical inference technique may similarly be used to automatically track the removal of patch cords from the communications patching system and/or situations where a technician changes the connection on one end of an already-installed patch cord. In particular, when a patch cord is removed from one of the patch panel connector ports, the system administration software is notified of this removal by the plug insertion/removal sensor. The sensor then waits for a control signal from the plug insertion/removal sensor that is associated with the patch panel connector port that receives the plug on the other end of the patch cord at issue and, upon receipt of this control signal, deletes the connection that was previously formed by the patch cord at issue from the connectivity database. If the technician only unplugs one end of the patch cord (which removal is communicated to the system administration software by the plug insertion/removal sensor on the patch panel connector port) and then proceeds to plug the free end of this patch cord into another one of the patch panel connector ports, the system administration software will receive signals indicating that a patch cord insertion was performed immediately after a patch cord removal as opposed to two patch cord removals occurring back-to-back. In response to sensing such a sequence of events, the system administration software may then ask the technician to confirm that he or she is changing a connection (i.e., unplugging one end of one of the patch cords and then plugging it back into a different patch panel connector port) as opposed to removing a patch cord in its entirety. Once the technician confirms that a connection change is being made, the system administration software can automatically change the connection information stored in the connectivity database to reflect the connection change. Thus, so long as the technicians properly follow established conventions, the logical inference technique may be used to automatically track the addition of new connections, the removal of existing connections, and changes to existing connections in a cross-connect communications patching system in order to maintain an accurate connectivity database.

While the logical inference technique may work well in cross-connect communications patching systems, it has limitations when used in an interconnect communications patching system. As noted above, in an interconnect communications patching system, each patching connection extends directly between a patch panel connector port and a connector port on a network switch. Unfortunately, network switches are not generally available that include plug insertion/removal sensors, and it is unlikely that network switches that include such sensors will be introduced in the future since patch panels and network switches are manufactured by different vendors. Consequently, in an interconnect communications patching system the system administration software generally does not have a way of automatically confirming that a patch cord was plugged into a connector port on a network switch, which limits the effectiveness of the logical inference techniques in such patching systems.

Network switches are now available that perform diagnostic tests on the electrical cables (e.g., patch cords, horizontal cables, etc.) that are connected thereto. By way of example, network switches are available that utilize time domain reflectometry ("TDR") techniques to detect cable lengths and/or distance to faults in a communications cabling channel. TDR refers to a technique where a TDR control signal is transmitted along one or more conductors of a channel that may consist of one or more cabling segments and/or connectors. The TDR control signal may be any appropriate signal such as a pulsed signal, a non-pulsed signal, etc., and may, in some cases, comprise a series of TDR control signals that are transmitted at, for example, different frequencies. A reflection of the TDR control signal is received by, for example, the network switch. The reflection of the TDR control signal may be used to determine the length of the communications channel based on, for example, either the time that passes between the transmission of a TDR control signal and the receipt of its reflection and/or by comparing the received reflection of the TDR control signal to a previously recorded "baseline" reflection (which is typically referred to as a "TDR signature") to identify the distance to the end of the channel. In addition to TDR, other techniques such as frequency domain analysis, joint time-frequency domain reflectometry, etc. may also or alternatively be used to perform diagnostic tests on electrical cabling that is connected to a network switch or other network device.

Pursuant to embodiments of the present invention, methods and systems are provided that use both electrical cable diagnostic tests and logical inference techniques to track connectivity in interconnect communications patching systems. While these methods and systems will be discussed below primarily with respect to TDR-based electrical cable diagnostic tests, it will be appreciated that in other embodiments different types of electrical cable diagnostic tests may be used such as, for example, frequency domain analysis or joint time-frequency domain reflectometry. The methods and systems according to embodiments of the present invention may, for example, utilize the fact that when a patch cord is not plugged into a particular connector port on a network switch, a TDR-enabled network switch will record the "distance to fault" for that connector port as being zero (or a distance that is very close to zero). Thus, if a plug is inserted into a network switch connector port, the distance-to-fault for that connector port will change from approximately zero to some distance that is substantially greater than zero. Likewise, if a plug is removed from a network switch connector port, the distance-to-fault for that connector port will change from a distance that is substantially greater than zero to a distance of approximately zero. Consequently, the network switches may be programmed to use TDR tests to act, in effect, as a plug insertion/removal sensor for each connector port thereof, and the results of these TDR tests may be reported to system administration software or some other system controller. Since an interconnect communications patching system that uses TDR in this manner will have, in effect, plug insertion/removal sensors at both the patch panel connector ports and the network switch connector ports, it may use the above-described logical inference techniques to automatically track patch cord insertions, removals and changes.

Embodiments of the present invention will now be discussed in further detail with reference to the attached figures.

FIG. 1 illustrates a simplified interconnect communications patching system 10 according to embodiments of the present invention. The interconnect communications patching system 10 may be used to connect computers, printers and other "work area" end devices 20 to network equipment that is located in a computer room 14. As shown in FIG. 1, an end device 20 (which is illustrated as being a computer, but could be other end devices such as a printer, facsimile machine, etc.) that is located in a work area 12 is connected by a patch cord 22 to a modular wall jack 24. A horizontal cable 28 is routed from the back end of the wall jack 24 through the walls of the building to the computer room 14. While only a single work area end device (computer 20) is shown in FIG. 1, it will be appreciated that a typical system includes hundreds or thousands of work area end devices 20, wall jacks 24 and horizontal cables 28.

As is further shown in FIG. 1, a plurality of patch panels 32 are mounted on a first equipment rack 30 in the computer room 14. Each patch panel 32 includes a plurality of connector ports 34 mounted thereon. Each of these connector ports 34 has a back end that receives one of the horizontal cables 28 and a front side that includes a plug aperture that receives the plug of a patch cord. The connector ports 34 are used to electrically connect a patch cord to a horizontal cable 28. Each of the connector ports 34 includes an associated plug insertion/removal sensor 36 that may be used to automatically sense each time a patch cord plug is inserted into, or removed from, the connector port 34 that the sensor 36 is associated with. In FIG. 1, each connector port 34 comprises an RJ-45 jack. However, it will be appreciated that other types of connector ports may be used.

Network devices such as network switches 42 and network routers and/or servers 46 are mounted on a second equipment rack 40. Each of the network switches 42 has a plurality of connector ports 44, and each network router and/or server 46 also includes one or more connector ports. An external communications line 52 is connected to one of the network devices 46. A set of patch cords 50 is used to interconnect the connector ports 44 on the network switches 42 to respective ones of the connector ports 34 on the patch panels 32. A second set of patch cords 54 interconnects other of the connector ports 44 on the network switches 42 with the connector ports on the network routers/servers 46. In order to simplify FIG. 1, only a single patch cord 50 and a single patch cord 54 are shown.

A rack controller 38 is also mounted on the first equipment rack 30. This rack controller 38 collects information from the patch panels 32 and passes the collected information to a system administrator computer 70 that has system administration software 72 running thereon. The rack controller 38 may include a central processing unit ("CPU") and a display. The rack controller 38 may be interconnected with rack controllers 38 that are provided on other patch panel equipment racks of the communications system (not shown) so that the rack controllers 38 can communicate in a common network as if they were a single controller. The CPU of rack controller 38 may include a remote access port that enables its CPU to be accessed by a remote computer such as, for example, the system administrator computer 70. The rack controller 38 may, for example, gather data from intelligent tracking capabilities of the patch panels 32, as will be explained herein.

While not shown in FIG. 1, a rack controller 38 may also be provided on equipment rack 40, and each of the network switches 42 and other network devices 46 may be in communication with this rack controller 38. Alternatively, the network switches 42 and/or the network devices 46 may be in direct communication with, for example, the system administration computer 70 via a different communications path (not shown).

Communications from a particular work area end device (e.g., computer 20) are transmitted over the patch cord 22, through the wall jack 24, over the cable 28, through a patch panel connector port 34 and through a patch cord 50 to one of the network switches 42, and this network switch 42 then routes those communications towards their intended destination (e.g., to another work area device 20, a network device 46, or to the external communication line 52 for transmission over the Internet). The network switches 42 likewise receive communications from internal or external sources and route these communications to the intended work area devices 20.

As discussed above, a technician may add or remove patch cords 50 that extend between the patch panel connector ports 34 and the network switch connector ports 44, or may change an existing connection of a patch cord 50 in order to connect a particular modular wall jack 24 to a different one of the network switch connector ports 44. As is also noted above, many network switch vendors (and perhaps vendors of other Ethernet network devices such as servers, routers, etc.) have incorporated electrical cable diagnostic testing features which detect faults in the cabling attached thereto. By way of example, Marvell's network switches now include a "Virtual Cable Tester" feature that uses TDR to determine a distance to any fault in the attached cabling. The communications patching system 10 according to embodiments of the present invention use these TDR capabilities (or other electrical cable diagnostic testing features) on the network devices to automatically track these patching connection changes in communications networks that include interconnect communications patching systems as follows.

The network switches 42 may be programmed to periodically run TDR tests on each of their connector ports 44 to determine the length of the channel (if any) that is connected thereto. The results of these TDR tests may be compared to stored data to detect network switch connector ports 44 that have experienced a change in the overall distance of their attached communications channel. In the example of FIG. 1, the channel length may be, for example, the combined length of the cables and patch cords that connect the end device 20 to a particular network switch connector port 44. In some embodiments, the stored data may be a previously determined channel length, and the TDR test may be performed to obtain an updated channel length. As noted above, if the previously determined channel length was substantially greater than zero and the updated channel length is approximately zero, this change in the determined channel length may be interpreted as indicating that a patch cord 50 has been removed from the network switch connector port 44 at issue (since if no patch cord is connected to the connector port 44, the length of the channel is approximately zero). Alternatively, if the previously determined channel length was approximately zero and the updated channel length is substantially greater than zero, then this change in channel length may be interpreted as indicating that a patch cord 50 has been plugged into the network switch connector port 44 at issue. In this fashion, the TDR tests performed by the network switches 42 may be used to detect plug insertions and removals, and hence may be programmed to operate as a plug insertion/removal sensor.

The firmware on the network switches 42 may also be programmed to report plug insertions and removals that are detected using these TDR tests to a common controller such as the system administration software 72 that executes on the system administration computer 70. This reporting may be accomplished, for example, using Simple Network Management Protocol or "SNMP" communications such as SNMP traps. As known to those of skill in the art, an SNMP trap refers to an asynchronous communication that is forwarded from a managed network device to an administrative computer. The SNMP trap (or other reporting communication) can report, for example, identification information for the network switch 42 (e.g., a serial number or a MAC ID for the network switch 42), the port number of the connector port 44 for which the plug insertion or removal was detected, the type of event detected (e.g., a plug insertion or a plug removal), and perhaps a time stamp indicating when the plug insertion or removal was first detected (or, alternatively, a time range when the plug insertion or removal occurred). The patch panels 32 may likewise report detected plug insertions and removals to the system administration software 72 as plug insertions and/or removals are detected by the plug insertion/removal sensors associated with each patch panel connector port 34. If the system administration software 72 identifies a plug insertion on the one of the patch panel connector ports 34 that is consecutively followed by a plug insertion on one of the network switch connector ports 44, the system administration software 72 may make a logical inference that these two consecutive plug insertions reflect the addition of a new patch cord 50, and may log the patch cord connection between the identified patch panel and network switch connector ports 34, 44 in a connectivity database 74 that is maintained, for example, on the system administration computer 70. Similarly, if the system administration software identifies a plug insertion on the one of the network switch connector ports 44 that is consecutively followed by a plug insertion on one of the patch panel connector ports 34, the system administration software may make a logical inference that these two consecutive plug insertions also reflect the addition of a new patch cord 50, and may log the patch cord connection between the identified patch panel and network switch connector ports 34, 44 in the connectivity database 74.

In a similar manner, if the system administration software 72 identifies a plug removal on the one of the patch panel connector ports 34, that is consecutively followed by a plug removal on one of the network switch connector ports 44, the system administration software 72 may make a logical inference that these two consecutive plug removals reflect the removal of the patch cord 50 that extended between a patch panel connector port 34 and a network switch connector port 44. The system administration software 72 may check the connectivity database 74 and confirm that a patching connection previously extended between these connector ports 34, 44 and may then remove this patch cord connection from the connectivity database 74. The same procedure may be followed if the system administration software 72 identifies a plug removal on one of the network switch panel connector ports 44 that is consecutively followed by a plug removal on one of the patch panel connector ports 34. In either case, if the system administration software 72 identifies a plug removal on one of the network switch panel connector ports 44 that is consecutively followed by a plug removal on one of the patch panel connector ports 34, and then determines that the connectivity database 74 does not include a patching connection between the two identified connector ports 34, 44, then an error message may be sent to a network administrator.

The communications patching systems according to embodiments of the present invention may also logically infer patching changes. By way of example, if the system administration software 72 determines that a plug removal has occurred on a first of the patch panel connector ports 34 that is consecutively followed by a plug insertion on a second of the patch panel connector ports 34, the system administration software 72 may make a logical inference that these two events that were detected back-to-back reflect that the end of a patch cord 50 was removed from the first patch panel connector port 34 and plugged into the second patch panel connector port 34 to implement a connectivity change. The connectivity database 74 may then be updated to remove the previously existing patch cord connection and replace it with the new patch cord connection. Similarly, if the system administration software 72 determines that a plug removal on a first of the network switch connector ports 44 was consecutively followed by a plug insertion on a second of the network switch connector ports 44, the system administration software 72 may make a logical inference that these two consecutive detected events reflect that the end of a patch cord was removed from the first network switch connector port 44 and plugged into the second network switch connector port 44 to implement a connectivity change, and the connectivity database 74 may once again be updated to reflect this connectivity change. Thus, in the above fashion, the combination of (1) plug insertion/removal sensors on the patch panel connector ports 34, (2) the use of TDR tests to sense plug insertions and removals at the network switch connector ports 44, and (3) the use of logical inference techniques may be used to automatically track patch cord connections in an interconnect communications patching system.

FIGS. 2A-2B illustrate a patch panel 100 that may be used, for example, to implement the patch panels 32 of FIG. 1. FIG. 2A is a front view of the patch panel 100, while FIG. 2B is a schematic front view of a portion of a printed circuit board 130 of patch panel 100.

As shown in FIG. 2A, the exemplary patch panel 100 includes a mounting frame 110 and twenty-four connector ports 120 that are, in this embodiment, arranged as four groups of six connector ports 120. Each connector port 120 is implemented as an RJ-45 jack. A printed circuit board 130 is mounted on the front face of the mounting frame 110 and includes cut-out areas for each of the connector ports 120. The printed circuit board 130 is shown in outline representation in FIG. 2A as it may be partly or completely hidden beneath a cover or other protective or aesthetic housing. Trace buttons 140 and light emitting diodes ("LED") 150 may be mounted on the printed circuit board 130 adjacent each of the connector ports 120. The trace buttons 140 and LEDs 150 may be electrically connected to a processor 180 (see FIG. 2B) such as a microprocessor, microcontroller, ASIC or the like, and may be used, for example, to perform line tracing functions and/or to report detected plug insertions and removals. In some embodiments, the trace buttons 140 and/or the LEDs 150 may be omitted. As is also shown in FIG. 2A, the patch panel 100 further includes a connection 160 that receives one end of a communications cable 170 (e.g., a ribbon cable, an RJ-45 patch cord, etc.). The other end of the communications cable 170 may be connected directly or indirectly to, for example, a rack manager 38 (see FIG. 1). The connection 160 and communications cable 170 provide a communications path that allows information to be communicated to and from the components that are mounted on the printed circuit board 130 of patch panel 100 and the rack controller 38 (or other external processing device). A power connection may also be provided (not shown) that provides power to the patch panel 100.

FIG. 2B is an enlarged schematic front view of a portion of the printed circuit board 130 of the intelligent patch panel 100 of FIG. 2A. The printed circuit board 130 may be generally rectangular in shape, and is mounted on top of the connector ports 110 (which are accessible through apertures in the printed circuit board 130 in the particular embodiment of FIGS. 2A-2B). The trace buttons 140 and the LEDs 150 are mounted on the printed circuit board 130 and are positioned to be above a respective one of the connector ports 120. The patch panel 100 may also include a plug insertion/removal sensor 190 for each of the connector ports 120. The processor 180 is mounted on the printed circuit board 130 and is in communications with the sensors 190 via, for example, conductive traces on the printed circuit board 130. While not shown in FIG. 2B to simplify the drawing, it will be appreciated that conductive traces or other control lines are provided between the processor 180 and the trace buttons 140 and LEDs 150 that are used to send and receive control and/or power signals to the trace buttons 140 and LEDs 150.

Any appropriate plug insertion/removal sensors 190 may be used. In some embodiments, the plug insertion/removal sensors 190 may comprise mechanical switches. In other embodiments, the plug insertion/removal sensors 190 may comprise infrared emitters and detectors that are mounted on opposite sides of each connector port 120 so that the presence or absence of a plug can be detected based on whether or not the infrared signal that is emitted by the infrared emitter is received at the corresponding infrared detector (which will not occur when a plug is present in the connector port, as the plug will block the infrared signal). In still other embodiments, passive optical-based sensors, light emitting diodes (LEDs) coupled with photodiodes, and/or electrical based sensors may be used to implement the plug insertion/removal sensors 190. In still other embodiments, plug insertions and removals may be sensed by sensing a change in capacitance across the plug aperture of a connector port. Thus, it will be appreciated that the plug insertion/removal sensors 190 may be implemented as any appropriate sensor or circuit that can detect the insertion and removals of plugs from the connector port.

Various embodiments of the present invention will now be described with reference to the flow charts of FIGS. 3A-3B. These flow charts illustrate methods of automatically identifying the insertion of new patching connections, the removal of existing patching connections and changes to existing patching connections in a communications patching system. The operations of the flow charts of FIGS. 3A-3B are described below with reference to the communications network illustrated in FIG. 1.

FIG. 3A is a flow chart illustrating a method of automatically identifying a new patch cord connection in a communications patching system according to certain embodiments of the present invention. As shown in FIG. 3A, operations may begin when a plug insertion/removal sensor detects an insertion of a first plug of a patch cord 50 into a first connector port 34 of a patch panel 32 (block 200). Next, one or more electrical cable diagnostic tests such as, for example, TDR tests, may be performed to detect an insertion of a second plug into a first connector port on a network switch (block 205). These electrical cable diagnostic tests may be run by one or more of the network switches 42 of FIG. 1 and may be used to determine the length of the channel(s) connected to one or more of the connector ports 44 included on the network switches 42. If a connector port 44 on the network switch 42 that had a previously determined channel length of approximately zero is shown by the electrical cable diagnostic test to now have a channel length that is greater than approximately zero, then this change in channel length may be interpreted as indicating that a plug has been inserted into the connector port 44 at issue. Thus, the system may infer that a new patch cord connection has been established between the first connector port 34 of the patch panel 32 and the first connector port 44 of the network switch 42 based on the consecutive detections of the insertions of the first and second plugs (block 210).

FIG. 3B is a flow chart illustrating a method of automatically identifying the removal of a patch cord connection in a communications patching system according to certain embodiments of the present invention. As shown in FIG. 3B, operations may begin when a plug insertion/removal sensor detects 36 that a plug has been removed from a first connector port 34 of a patch panel 32 (block 220). Next, one or more electrical cable diagnostic tests such as, for example, TDR tests may be run to detect a removal of a second plug from a first connector port 44 on a network switch 42 (block 225). These electrical cable diagnostic tests may be used to determine the length of the channel(s) connected to one or more of the connector ports 44 included on the network switches 42. If a connector port 44 on the network switch 42 that previously had a channel length of greater than approximately zero is determined by the electrical cable diagnostic test to now have a channel length of approximately zero, this change in channel length may be interpreted as indicating that a plug has been removed from the connector port 44 at issue. Next, the connectivity database 74 may be consulted to determine if a patching connection previously existed between the first connector port 34 of the patch panel 32 and the first connector port 44 of the network switch 42 (block 230). Finally, the system may infer that a patch cord that connected the first connector port 34 of the patch panel 32 to the first connector port 44 of the network switch 42 has been removed based on the consecutive detections of the removals of the first and second plugs (block 235).

FIG. 3C is a flow chart illustrating a method of automatically identifying that a change has been made to a patch cord connection in a communications patching system according to certain embodiments of the present invention. As shown in FIG. 3C, operations may begin with a network switch 42 running an electrical cable diagnostic test (e.g., a TDR test) to detect a removal of a first plug from a first connector port thereof (block 240). As noted above, if a connector port 44 on the network switch 42 that previously had a channel length of greater than approximately zero is determined by the electrical cable diagnostic test to now have a channel length of approximately zero, this change in channel length may be interpreted as indicating that a plug has been removed from the connector port 44 at issue. Next, the network switch 42 may run a second electrical cable diagnostic test to detect an insertion of a second plug into a second connector port 44 thereof (block 245). As discussed above, if a connector port 44 on the network switch 42 that previously had a channel length of approximately zero is determined by the electrical cable diagnostic test to now have a channel length that is greater than approximately zero, then this change in channel length may be interpreted as indicating that a plug has been inserted into the connector port 44 at issue. Finally, the system may infer that a first and second plugs are the same plug based on the consecutive detection of the removal of the first plug and the insertion of the second plug (block 250). In this manner, the system may identify that that a patching change has been made to remove one end of the patch cord 50 at issue from the first connector port 44 on the network switch 42 and to plug that end of the patch cord 50 into the second connector port 44 on the network switch 42.

Additional embodiments of the present invention will now be described with reference to the flow charts of FIGS. 4A-4B. These flow charts likewise illustrate generally more complex methods of automatically identifying the insertion of new patching connections, the removal of existing patching connections and changes to existing patching connections in a communications patching system. The operations of the flow charts of FIGS. 4A-4B are again described with reference to the communications network illustrated in FIG. 1. While the description of these methods below assumes that the electrical cable diagnostic tests that are performed are TDR tests, it will be appreciated that in other embodiments other types of electrical cable diagnostic tests may alternatively be used.

Figure 4A:
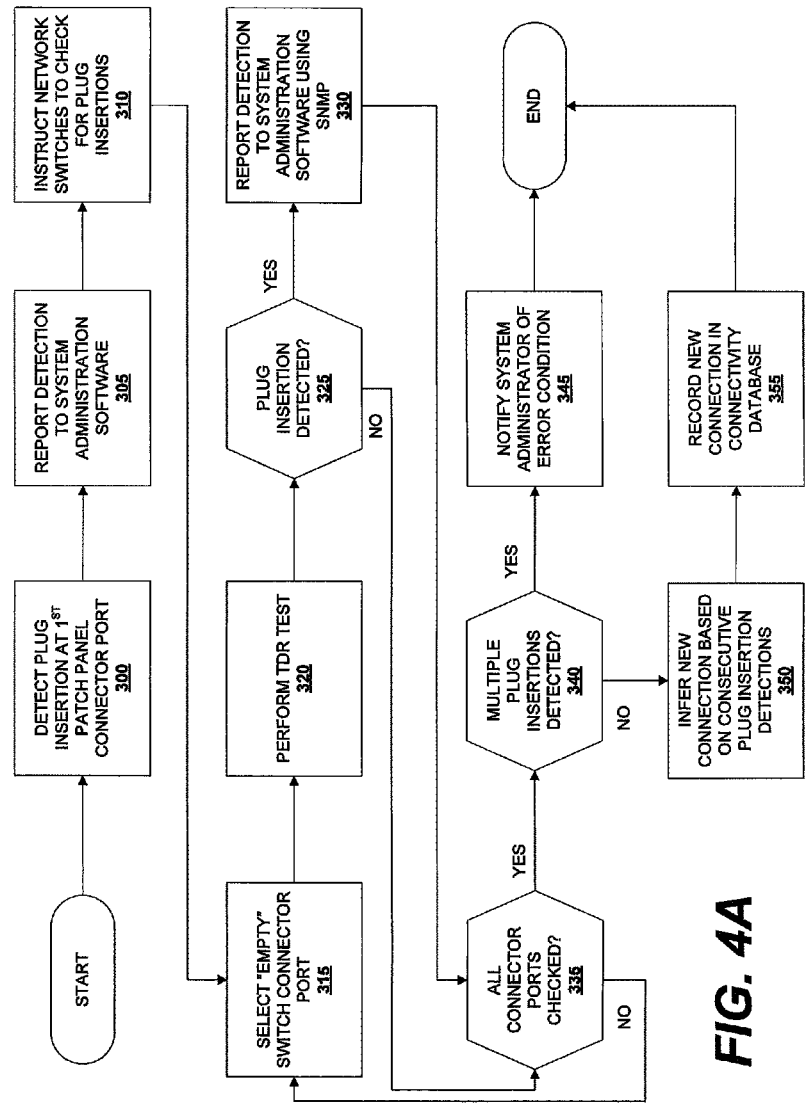
FIG. 4A is a flow chart diagram illustrating a method of automatically identifying a new patching connection according to further embodiments of the present invention.

FIG. 4A is a flow chart illustrating a method of automatically identifying a new patch cord connection in a communications patching system according to further embodiments of the present invention. As shown in FIG. 4A, operations may begin when a plug insertion/removal sensor detects 36 an insertion of a first plug of a patch cord 50 into a first connector port 34 of a patch panel 32 (block 300). The processor on the patch panel 32 notifies the rack manager 38 that a plug insertion has been detected on the first connector port 34, and the rack manager 38 passes this notification onto the system administration software 72 that is running on the system administration computer 70 (block 305).

Next, the system administration software 72 sends a control signal to the network switches 42 that instructs the network switches 42 to perform TDR tests to check to see if any plug insertions have occurred on their connector ports 44 (block 310). In response to this control signal, each network switch 42 may identify the connector ports 44 thereof that currently (or at least as of the last time a check was made) do not have a patch cord inserted therein (i.e., the "empty" connector ports). The network switch 42 can do this in a variety of ways such as, for example, accessing the connectivity database 74 (which may be located remotely at the system administration computer 70) to determine which connector ports 44 are logged as not being connected to a patch panel connector port 34. Alternatively, the network switch 42 may identify connector ports 44 thereof that currently do not have an active link (as this information is stored in memory at each network switch 42), and use this as an approximation of the identification of the network switch connector ports 44 that do not have a patch cord inserted therein.

The network switch 42 may then select one of the identified connector ports 44 (block 315) and perform a TDR test thereon to determine the length of the channel through the connector port 44 (block 320). If the channel length is greater than approximately zero, whereas the stored previously determined channel length was approximately zero, then the network switch 42 may be programmed to infer from this change in channel length that a patch cord has been plugged into the network switch connector port 44 at issue (block 325). The network switch 42 may then report to the system administration software 72 that a plug insertion has occurred at the connector port 44 at issue (block 330). If at block 325 it is determined that a plug insertion did not occur at the connector port 44 at issue, then the reporting operation of block 330 is skipped. In either case, operations then proceed to block 335, where a determination is made as to whether or not TDR tests have been performed on all of the "empty" connector ports 44. If not operations return to block 315 where the foregoing operations are repeated on the next "empty" connector port 44 on the network switch 42. Once TDR tests have been run on all of the "empty" connector ports 44, then operations proceed to block 340 where a determination is made as to whether or not a single plug insertion has been detected on the connector ports 44 of the network switches 42.

While not shown in FIG. 4A in order to simplify the flow chart, if a total of zero plug insertions are detected on the connector ports 44 of the network switches 42, then operations may return to block 310 (perhaps after allowing a predetermined delay time to pass) in order to again search for a plug insertion at the network switches 42. This may be necessary if, for example, the TDR tests of block 320 are performed on some or all of the connector ports 44 before the technician inserts the other end of the new patch cord connection into a network switch connector port 44. If instead at block 340 it is determined that patch cords have been plugged into two or more of the network switch connector ports 44 since the last time TDR tests were run, then a system administrator is notified that an error condition exists (block 345) as the system, in this case, does not have a valid way of telling which of the network switch connector ports 44 received the second end of the newly-added patch cord 50, and operations may then end. Finally, if only a single plug insertion is detected at the network switch connector ports 44, then the system infers that the network switch connector port 44 that received the plug is connected to the patch panel connector port that had a plug insertion detected at block 300 of FIG. 4A (block 350). This new patch cord connection may then be recorded in the connectivity database 74 (block 355), and operations may end.

Figure 4B:
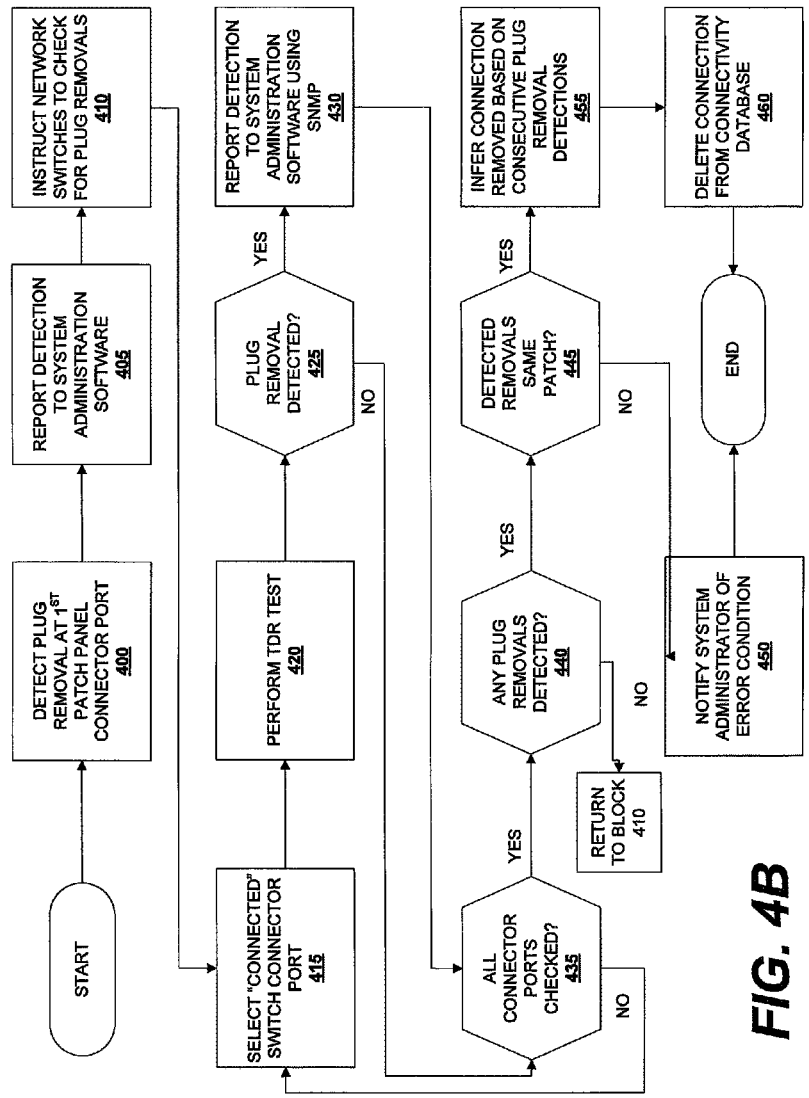
FIG. 4B is a flow chart diagram illustrating a method of automatically identifying the removal of a patch cord connection according to further embodiments of the present invention.

FIG. 4B is a flow chart illustrating a method of automatically identifying the removal of a patch cord from a communications network according to further embodiments of the present invention. As shown in FIG. 4B, operations may begin when a plug insertion/removal sensor 36 detects the removal of a first plug from a first connector port 34 of a patch panel 32 (block 400). Next, the processor on the patch panel 32 notifies the rack manager 38 that a plug removal from the first connector port 34 has been detected, and the rack manager 38 passes this notification onto the system administration software 72 that is running on the system administration computer 70 (block 405).

Next, the system administration software 72 sends a control signal to the network switches 42 that instructs the network switches 42 to perform TDR tests to check to see if any plug insertions or removals have occurred on their connector ports 44 (block 410). The discussion below explains the operations that may occur when a plug removal is detected (since consecutive plug removals indicate the removal of a patch cord), while FIG. 4C explains operations that occur when a plug insertion follows a plug removal (since this sequence of events indicates an existing patching connection has been changed).

In response to the control signal that is transmitted at block 410, each network switch 42 may identify the connector ports 44 thereof that currently (or at least as of the last time a check was made) have a patch cord inserted therein (i.e., the "connected" connector ports 44). The network switch 42 can do this in a variety of ways such as, for example, accessing a connectivity database 74 to determine which connector ports 44 are indicated as being connected to a patch panel connector port 34. The network switch 42 may then select one of the "connected" connector ports 44 (block 415) and perform a TDR test thereon to determine the length of the channel through the connector port 44 (block 420). If this TDR test returns a channel length of approximately zero, whereas the stored previous channel length was greater than approximately zero, then at block 425 the network switch 42 may be programmed to infer from this change in channel length that a patch cord has been removed from the connector port 44 at issue. The network switch 42 may then report to the system administration software 72 using, for example, SNMP, that a plug removal has occurred at the connector port 44 at issue (block 430). If at block 425 it is instead determined that a plug removal did not occur at the connector port 44 at issue, then the reporting operation of block 430 is skipped. In either case, operations then proceed to block 435 where a determination is made as to whether or not TDR tests have been performed on all of the "connected" connector ports 44. If not, operations return to block 415 where the foregoing operations are repeated on the next "connected" connector port 44 on the network switch 42. Once TDR tests have been run on all of the "connected" connector ports 44, then operations proceed to block 440 where a determination is made as to whether or not any plug removals were detected on the connector ports 44 of the network switches 42 aside from the initial detection made at block 400.

If, at block 440, it is determined that no plug removals were detected at the connector ports 44 of the network switches 42 (aside from the initial detection made at block 400), then operations may return to block 410 (perhaps after allowing a predetermined delay time to pass) in order to again search for a plug removal at the network switches 42. This may be necessary if, for example, the TDR tests of block 420 are performed on some or all of the connector ports 44 before the technician removes the other end of the patch cord 50. If, instead, at block 440 it is determined that patch cords have been removed from one or more network switch connector ports 44 since the last time TDR tests were run, then a determination is made as to whether a patch cord was removed from the network switch connector port 44 that the connectivity database indicates should contain the other end of the patching connection that is connected to the patch panel connector port 34 identified at block 400 (block 445). If not, an error condition may exist, and a system administrator is notified (block 450). If at block 445 it is determined that a patch cord was removed at the network switch connector port 44 that the connectivity database indicates should contain the other end of the patching connection at issue, then the system infers that the patching connection associated with the patch panel connector port 32 from which a patch cord removal was detected has been fully removed from the patching system (block 455). The patching connection at issue may then be removed from the connectivity database 74 (block 460), and operations may end.

Figure 4C:
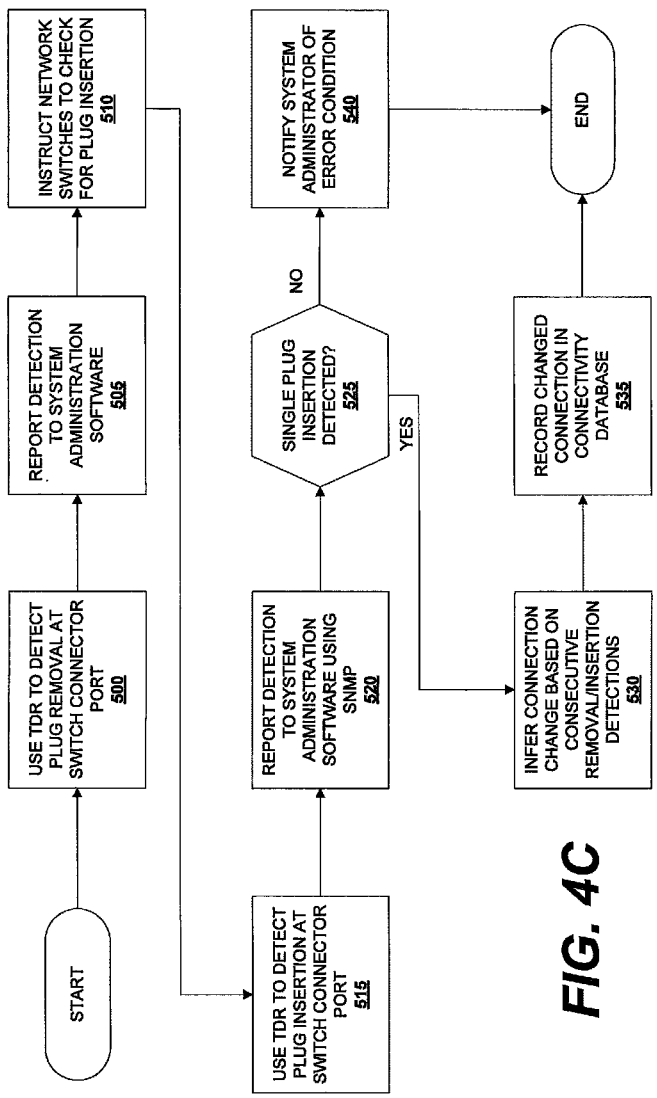
FIG. 4C is a flow chart diagram illustrating a method of automatically identifying a change to a patching connection according to further embodiments of the present invention.

FIG. 4C is a flow chart illustrating a method of automatically identifying a change that is made to a patch cord connection in a communications patching system according to further embodiments of the present invention. As shown in FIG. 4C, operations may begin with a network switch 42 determining using TDR test(s) that a plug has been removed from one of the connector ports 44 thereon (block 500). The TDR tests that are used to detect the removal may be, for example, the TDR tests that are discussed above with respect to FIG. 4B. The network switch 42 may then notify the system administration software 72 that a plug removal from the connector port 44 has been detected (block 505).

Next, the system administration software 72 sends a control signal to the network switches 42 that instructs the network switches 42 to perform TDR tests to check to see if any plug insertions have occurred on their connector ports 44 (block 510). In response to this control signal, the network switches may then use TDR test(s) to determine if a plug has been inserted into one of the connector ports 44 thereon (block 515). The TDR tests that are used to detect this plug insertion may be, for example, the TDR tests that are discussed above with respect to FIG. 4A. The network switch 42 may then notify the system administration software 72 that a plug insertion has been detected at one of the connector ports 44 (block 520).

If a single plug insertion is detected at the network switch connector ports 44 (block 525), then the system administration software 72 infers that the network switch connector port 44 at which the plug insertion was detected received the patch cord plug that was detected at block 500 as having been removed from another connector port 44 at block 500 (block 530). The connectivity database 74 may then be updated to replace the prior connection with the new connection (block 535), and operations may end. If instead at block 525 it is determined that patch cords have been plugged into two or more of the network switch connector ports 44 since the last time TDR tests were run, then a system administrator is notified that an error condition exists (block 540) and operations may then end.

Figure 5:
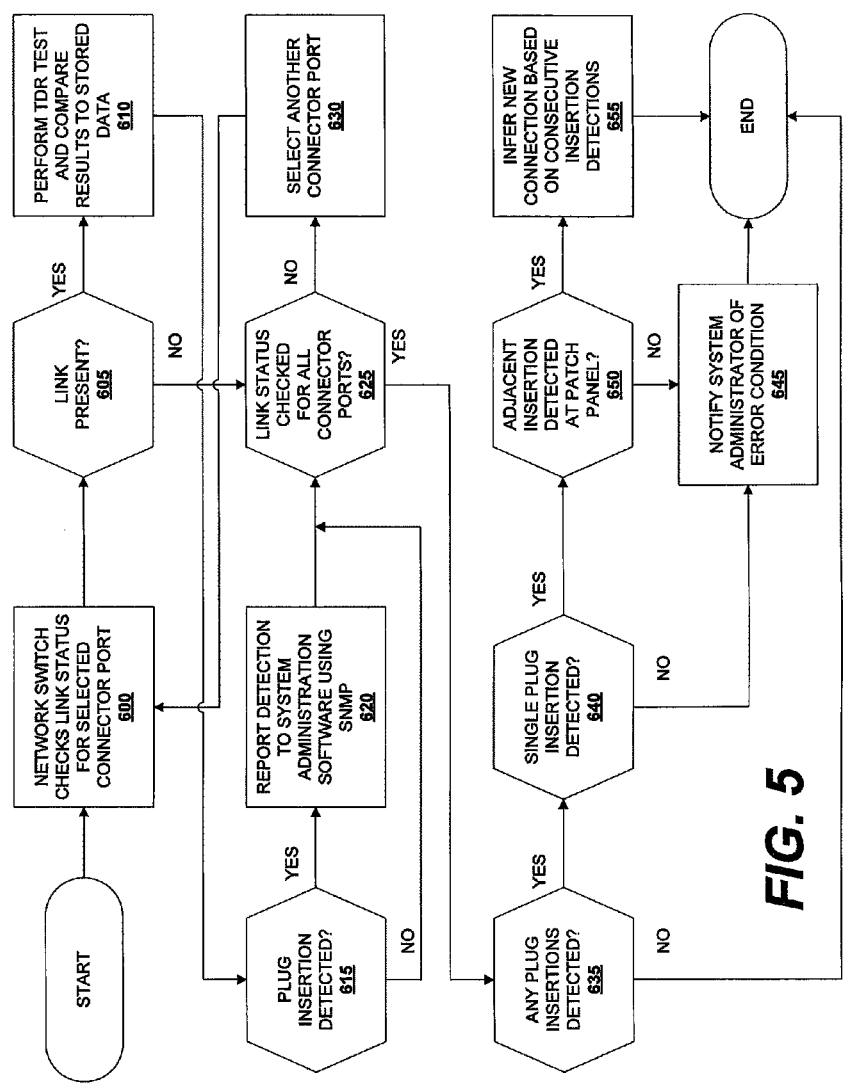
FIG. 5 is a flow chart diagram illustrating a method of automatically identifying the insertion of new patching connection according to still further embodiments of the present invention.

FIG. 5 is a flow chart illustrating a method of automatically identifying a new patch cord connection between a patch panel connector port and a network switch connector port according to still further embodiments of the present invention. As shown in FIG. 5, operations may begin with the network switch checking the link status for a selected connector port (block 600). If the network switch determines that a link is up and running for the selected connector port at block 605, then the network switch performs a TDR test (or, in other embodiments, a different type of electrical cable diagnostic test) to determine a length of the channel connected to the selected connector port (block 610). This determined channel length is then compared as part of the operation at block 610 to a stored channel length that was determined for the selected connector port during a previous TDR test. If the stored channel length was approximately zero, and the determined channel length is found to be greater than approximately zero, then firmware in the network switch interprets the result of this comparison as indicating that a plug insertion has been detected at the selected connector port (block 615). When this occurs, the detected plug insertion is reported to system administration software using, for example, SNMP (block 620).

Once the operations of block 615 and block 620 (if performed) are completed, a determination is made as to whether or not the link status has been checked for all of the connector ports on the network switch (block 625). If they have not, then a connector port for which the link status has not yet been checked is selected (block 630) and operations return to block 600. Once the link status has been checked for all of the connector ports at block 625, a determination is made as to whether or not any plug insertions were detected (block 635). If none were, then operations may end. If at least one plug insertion was detected, then a determination is made as to whether or not a single plug insertion was detected (block 640). If, at block 640, it is determined that more than one plug insertion was detected, then a system administrator may be notified that an error condition exists (block 645). If, instead, only a single plug insertion was detected at the network switch, then a determination is made as to whether the plug insertion that was detected at the network switch connector port was adjacent in time to the detected plug insertion at the patch panel connector port (block 650). By "adjacent in time" (or, alternatively, "consecutive") plug insertions it is meant that the plug insertions that are detected at the network switch connector port and the patch panel connector port were detected back-to-back (in either order) without any intervening plug insertions or removals detected on other connector ports. If such "adjacent in time" or "consecutive" plug insertions are determined to have occurred at block 650, the system administration software may infer that a new patch cord has been inserted between the two connector ports at which the plug insertions were detected (block 655).

Pursuant to further embodiments of the present invention, the system administration software or another controller may use TDR tests (or other types of electrical cable diagnostic tests) as a plug insertion/removal sensor to track the completion of work orders. As known to those of skill in the art, state-of-the-art communications patching systems may issue work orders that guide system administrators in, among other things, adding new patching connections and in removing and/or changing existing patch cord connections. For example, a work order may be issued that calls for the removal of a patching connection between a particular patch panel connector port and a particular network switch connector port. The plug insertion/removal sensor associated with the patch panel connector port will detect the removal of the first end of the patch cord, and the TDR test run at the network switch will detect the removal of the second end of the patch cord from the connector port on the network switch. The system administration software may thus use these detections of the removal of the two ends of the patch cord to confirm completion of the work order. The system administration software could likewise confirm the completion of work orders calling for the addition of a new patch cord connection or a change to an existing patch cord connection in a similar manner.

It will be appreciated that while the systems described herein may be used to automatically track changes in patching connections, in order to ensure that all such changes are accurately tracked it may be necessary that the technicians who implement the changes follow certain conventions and/or procedures. If these conventions/procedures are not followed, then errors may arise in the connectivity database.

It will likewise be appreciated that various modifications may be required in the design and/or installation of the network switches (or other network devices) that perform the electrical cable diagnostic tests in order to implement the communications patching systems according to embodiments of the present invention. By way of example, the network switches (or other network devices) may need to be modified to periodically run electrical cable diagnostic tests on the connector ports thereof or to run such electrical cable diagnostic tests in response to a prompting that is received from a system controller. Additionally, the network switches will need to be in communication with the rack controllers or otherwise be in communication with the system administration software.

In some embodiments, the electrical cable diagnostic tests may be performed frequently in order to ensure that the plug insertions and removals at a network switch may be identified in the order that they are made. This may be necessary to ensure that a technician does not, for example, install two new patch cords before the next electrical cable diagnostic test is performed, as if this occurred the system would not be able to tell which of the two connector ports on the network switch received the new patch cords. Accordingly, in some embodiments, the technicians may be instructed to always start a patch cord insertion or removal operation at the patch panel, since the patch panel should instantaneously detect the insertion or removal of the plug. Once such a plug insertion or removal is detected, the system administration software can be programmed to instruct the network switch to perform a series of electrical cable diagnostic tests until a patch cord insertion or removal is detected or until a timer runs out. This can greatly reduce the frequency at which the electrical cable diagnostic tests must be performed, providing a more reliable system and reduced energy costs.

In some embodiments, the technicians may be instructed (or the system may be programmed) to always make patching changes at the patch panels instead of at the network switches, as patch cord insertions and removals will automatically be detected at the patch panels at the time the patching changes are made. Once again, such a convention may reduce the need to perform electrical cable diagnostic tests, and will reduce or eliminate the possibility that two patching changes may be made before the system detects that a change has occurred, which can prevent a logical inference based system from correctly tracking the patching connection changes.

As noted above, if the result of a TDR test indicates that a channel length associated with the connector port on the network switch (or other network device) is determined to be approximately zero, whereas prior to the TDR test the channel had a length that was substantially greater than zero, then this change in channel length may be inferred as indicating that a plug was removed from the connector port on the network switch. It will be understood that a channel length of approximately zero may be used because depending on the location of the TDR transmitter within the network switch, the TDR test may record a short channel length even if no patch cord is connected to the connector port due to, for example, the length of the conductive patch between the TDR transmitter and the connector port. Typically, this channel length will be less than one foot. Thus, references herein to channel lengths of "approximately zero" refer to channel lengths that are sufficiently small to indicate that no patch cord is plugged into the network switch connector port. Likewise, references herein to channel lengths that are "substantially greater than zero" refer to channel lengths that are larger than channel lengths of approximately zero (i.e., channel lengths that are large enough to indicate that a patch cord is present in the network switch connector port). The maximum channel length that may be considered to indicate that no patch cord is present within a network switch connector port may vary for different network switches, and may be set to an optimum or desired level.

While the communications patching systems and the components thereof have primarily been described above with respect to a few exemplary embodiments, it will be appreciated that numerous modifications are also within the scope of the present invention. For example, while in the above-described embodiments of the present invention the patching connections extend between patch panel connector ports and network switch connector ports, it will be appreciated that the present invention is not limited to such configurations. For instance, embodiments of the present invention may also be used to track patching connections in "home run" configurations where the patch panel connector ports are connected directly to connector ports on network devices such as network servers, network memory devices and the like. These network devices may be configured to run electrical cable diagnostic tests on their connector ports so as to use these tests as plug insertion/removal sensors. In some embodiments, the network cards on these network devices may be configured to perform the electrical cable diagnostic tests. Thus, in some embodiments of the present invention, electrical cable diagnostic tests may be combined with logical inference techniques to track patching connections in communications patching systems that are set up in home run configurations.

Embodiments of the present invention may have a number of distinct advantages over prior art intelligent patching approaches. For example, some embodiments of the present invention may use conventional communications cables and patch cords that do not include extra conductors, identification chips, special contacts and the like. The inclusion of such extra elements as required by various prior art intelligent patching approaches increase the cost of the cabling infrastructure, prevents use of the already installed cabling and patch cord base, may increase the size, weight and cost of the cabling and has various other potential disadvantages. The systems according to embodiments of the present invention work in both shielded and unshielded twisted pair communications systems, and provide solutions for tracking patch cord connections in both cross-connect and interconnect communications systems.

The present invention has been described with reference to the accompanying drawings, in which certain embodiments of the invention are shown. This invention may, however, be embodied in many different forms and should not be construed as limited to the embodiments that are pictured and described herein; rather, these embodiments are provided so that this disclosure will be thorough and complete, and will fully convey the scope of the invention to those skilled in the art. It will also be appreciated that the embodiments disclosed above can be combined in any way and/or combination to provide many additional embodiments.

Unless otherwise defined, all technical and scientific terms that are used in this disclosure have the same meaning as commonly understood by one of ordinary skill in the art to which this invention belongs. The terminology used in the above description is for the purpose of describing particular embodiments only and is not intended to be limiting of the invention. As used in this disclosure, the singular forms "a", "an" and "the" are intended to include the plural forms as well, unless the context clearly indicates otherwise. It will also be understood that when an element (e.g., a device, circuit, etc.) is referred to as being "connected" or "coupled" to another element, it can be directly connected or coupled to the other element or intervening elements may be present. In contrast, when an element is referred to as being "directly connected" or "directly coupled" to another element, there are no intervening elements present.

Certain embodiments of the present invention have been described above with reference to flowchart illustrations. It will be understood that some blocks of the flowchart illustrations may be combined or split into multiple blocks, and that the blocks in the flow chart diagrams need not necessarily be performed in the order illustrated in the flow charts.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of automatically identifying a new patch cord connection in a communications network, the method comprising:
   using a plug insertion/removal sensor to detect an insertion of a first plug of a patch cord into a first connector port of a patch panel;
   using an electrical cable diagnostic test to detect an insertion of a second plug of the patch cord into a first connector port on a network device;
   logging the patch cord connection between the first connector port of the patch panel and the first connector port of the network device based on consecutive detections of the insertions of the first and second plugs.

2. The method of claim 1, wherein the network device comprises a network switch, and wherein the electrical cable diagnostic test comprises a time domain reflectometry test.

3. The method of claim 1, wherein using the electrical cable diagnostic test to detect an insertion of the second plug into the first connector port on the network device comprises:
   conducting the electrical cable diagnostic test and determining based on the electrical cable diagnostic test that a length of the channel connected to the connector port on the network device is greater than approximately zero.

4. The method of claim 1, further comprising logging the connection between the connector port on the network device and the connector port on the patch panel in a connectivity database.

5. The method of claim 1, wherein the network device comprises a network switch and the first connector port of the network device is one of a plurality of connector ports on the network switch, and wherein the electrical cable diagnostic test is performed in response to detecting that a plug has been inserted into a plug aperture of the first connector port of the patch panel.

6. The method of claim 5, further comprising storing a channel length for at least some of the connector ports on the network switch.

7. The method of claim 6, wherein the electrical cable diagnostic test is performed on each connector port on the network switch that has a stored channel length of approximately zero.

8. A method of automatically identifying a removal of a patch cord connection in a communications network, the method comprising:

using a plug insertion/removal sensor to detect a removal of a first plug from a first connector port of a patch panel;

using an electrical cable diagnostic test that measures a length of an electrical cable to detect a removal of a second plug from a first connector port on a network device;

determining that a patch cord comprising the first plug and the second plug has been removed from the first connector port of the patch panel and the first connector port of the network device based on consecutive detections of the removals of the first and second plugs.

9. The method of claim 8, wherein the electrical cable diagnostic test comprises a time domain reflectometry test that is used to determine a channel length.

10. A method of automatically identifying a change to a patch cord connection in a communications network, the method comprising:

using a first electrical cable diagnostic test that measures a length of an electrical cable to detect a plug-removal event from a first connector port of a network device;

using a second electrical cable diagnostic test to detect a plug-insertion event into a second connector port of the network device;

determining that a patch cord plug has been removed from the first connector port of the network device and inserted into the second connector port of the network device based on consecutive detections of the plug-removal event and the plug-insertion event.

11. The method of claim 10, wherein the first and second electrical cable diagnostic tests each comprises a time domain reflectometry test that is used to determine a channel length.

12. The method of claim 10, wherein the first and second electrical cable diagnostic tests each measure electrical cable length.

13. A method of automatically identifying a new patch cord connection in a communications network, the method comprising:

using a plug insertion/removal sensor to detect an insertion of a first plug into a first connector port of a patch panel; and using an electrical cable diagnostic test to detect an insertion of a second plug into a first connector port on a network device;

wherein the network device comprises a network switch, and wherein the electrical cable diagnostic test comprises a time domain reflectometry test;

determining that a patch cord comprising the first plug and the second plug has been installed from the first connector port of the patch panel to the first connector port of the network device based on consecutive detections of the insertions of the first and second plugs.

14. The method of claim 13, further comprising logging a patch cord connection between the first connector port of the patch panel and the first connector port of the network device based on the consecutive detections of the insertions of the first and second plugs.

* * * * *